United States Patent [19]

Bryant

[11] Patent Number: 5,718,541
[45] Date of Patent: Feb. 17, 1998

[54] CUTTING TOOL FOR MACHINING TITANIUM AND TITANIUM ALLOYS

[75] Inventor: William A. Bryant, McKeesport, Pa.

[73] Assignee: Kennametal Inc., Latrobe, Pa.

[21] Appl. No.: 798,886

[22] Filed: Feb. 11, 1997

Related U.S. Application Data

[63] Continuation of Ser. No. 572,231, Dec. 13, 1995, abandoned.

[51] Int. Cl.$^6$ .................................................. B23B 27/14
[52] U.S. Cl. ........................... 407/118; 407/119; 407/120
[58] Field of Search .................................... 407/117, 118, 407/119, 120

[56] References Cited

U.S. PATENT DOCUMENTS

| | | | |
|---|---|---|---|
| 4,437,800 | 3/1984 | Araki et al. | 407/119 |
| 4,583,431 | 4/1986 | Komanduri et al. | 82/1 C |
| 4,590,031 | 5/1986 | Eichen et al. | 264/338 |
| 4,652,183 | 3/1987 | Veltri et al. | 407/119 |
| 4,716,083 | 12/1987 | Eichen et al. | 428/457 |
| 4,828,584 | 5/1989 | Cutler | 51/307 |
| 4,933,058 | 6/1990 | Bache et al. | 204/192.3 |
| 4,942,062 | 7/1990 | Ducarroir et al. | 427/249 |
| 4,984,940 | 1/1991 | Bryant et al. | 407/119 |
| 5,038,645 | 8/1991 | Walter et al. | 82/1.11 |
| 5,066,553 | 11/1991 | Yoshimura et al. | 407/119 X |
| 5,106,674 | 4/1992 | Okada et al. | 407/119 X |
| 5,131,481 | 7/1992 | Smith | 407/119 X |
| 5,145,739 | 9/1992 | Sarin | 428/336 |
| 5,173,328 | 12/1992 | Reiter et al. | 427/576 |
| 5,279,866 | 1/1994 | Bourget et al. | 427/575 |
| 5,292,417 | 3/1994 | Kügler | 204/192.13 |
| 5,325,747 | 7/1994 | Santhanam et al. | 82/1.11 |
| 5,405,448 | 4/1995 | Jost et al. | 118/723 E |
| 5,413,684 | 5/1995 | Bergmann | 204/192.13 |
| 5,415,756 | 5/1995 | Wolfe et al. | 204/192.23 |
| 5,418,003 | 5/1995 | Bruce et al. | 427/126.2 |
| 5,421,891 | 6/1995 | Campbell et al. | 118/723 R |
| 5,427,665 | 6/1995 | Hartig et al. | 204/192.12 |

FOREIGN PATENT DOCUMENTS

| | | |
|---|---|---|
| 1284030 | of 1970 | European Pat. Off. . |
| 1540718 | of 1976 | European Pat. Off. . |
| 0328084 | of 1989 | European Pat. Off. . |
| 3841730A1 | 6/1990 | Germany . |
| 0073392 | 6/1979 | Japan ................................ 407/119 |
| 2123039 | of 1983 | United Kingdom . |
| 2179678 | of 1986 | United Kingdom . |

OTHER PUBLICATIONS

Zlatin et al., "Procedures and Precautions in Machining Titanium Alloys", Titanium Sci. & Tech., vol. 1, (1973), pp. 489–504.

König, "Applied Research on the Machinability of Titanium and its Alloys", Proc. AGARD Conf. Advanced Fabrication Processes, (1978), pp. 1-1 through 1-10.

Komanduri et al., "New Observations on the Mechanism of Chip Formation when Machining Titanium Alloys", Wear, 69 (1981), pp. 179–188.

Christopher, "Trends in Cutting Tool Materials", 1981 Int'l. Conf. on Trends in Conventional and Non–Traditional Machining (1981), The Society of Carbide and Tool Engineers, pp. 195 and 211.

Jensen, "High Speed Milling of Titanium", Master of Science Theses at MIT (1984), pp. 1–151.

(List continued on next page.)

*Primary Examiner*—A. L. Pitts
*Assistant Examiner*—Henry W. H. Tsai
*Attorney, Agent, or Firm*—Stanislav Antolin

[57] ABSTRACT

A cutting tool for machining titanium and titanium alloys which comprises a tungsten carbide-containing substrate alone or with a tungsten carbide tip brazed thereto. The cutting tool further includes a hard coating on either the substrate alone or on the tungsten carbide tip. The coating may be PVD-applied tungsten carbide, CVD-applied boron carbide or PVD-applied boron carbide.

32 Claims, 1 Drawing Sheet

OTHER PUBLICATIONS

Lehtihet, "Face Milling Tool Geometry and Cutting Performance of Silicon Nitride Tool Materials", Ph.D. Dissertation at Lehigh University (1985), p. 123.

Trucks, "Machining Titanium Alloys", Machine and Tool Blue Book, (1987), pp. 39–41.

Min et al., "Diffusion Wear in Milling Titanium Alloys", Materials Science and Technology, vol. 4 (1988), pp. 548–553.

Bhattacharyya et al. "The Milling of Titanium with Coated Carbide Tools", Annals of 8th CBECIMAT, UNICAMP, Campinas, Spain (1988), pp. 271–275.

Chandrasekaran et al., "Role of Tool Microstructure and Stress–State upon the Wear Mechanisms in Milling", Annals of the CIRP, vol. 39 (1990), pp. 65–69.

Metals Handbook Ninth Edition, vol. 16, Machining (1989), pp. 602–606.

Chandler, "Machining of Reactive Metals", Metals Handbook Ninth Edition, vol. 16, Machining (1989), pp. 844–857.

Kennametal Tooling Apparatus Program Brochure, Kennametal Inc., Latrobe, PA (1990), pp. 3, 39–43.

Gettlemen et al., "Think Positive!", Modern Machine Stop (Oct. 1990) pp. 57–64.

Szyp, "Milling: Pushing Carbide to the Edge", Tooling & Production (May 1990), pp. 60–66.

Dillon et al., "The Effects of Temperature on the Machining of Metals", J. Materials Shaping Tech, vol. 8, No. 1 (1990), pp. 23–29.

Coll et al., "(Ti–Al)N Advanced Films Prepared by Arc Process", Materials Science and Engineering A140, (1991), pp. 816–824.

"Tooling Up for Exotic Cutting", Aircraft Engineering (May 1991) pp. 6 and 12.

"Tips for Aerospace Machining", Manufacturing Engineering (Mar. 1993), pp. 67–69.

Eckstein et al., "Face–Cut Milling of Titanium Alloys at High Cutting Rates", Verein Deutscher Ingenieure Zeitschrift 133 (12) (1991), pp. 28–31, 34 [English Translation].

Ezugwu et al., "Face Milling of Aerospace Materials", First International Conference on the Behavior of Materials in Machining, Stratford–upon–Avon, England (1988), Paper No. 3 (Institute of Metals) pp. 3.1 to 3.11.

Negishi et al., "Study of Tool Failure of Carbide Tools in Interrupted Turning", Annals of the CIRP, vol. 30, No. 1 (1981), pp. 43–46.

German Official Action dated Feb. 26, 1997 and English translation.

UK Examiner's Search Report dated Jan. 13, 1997.

Handbook of High Temperature Compounds: Properties, Production, Applications, Kosolapova, Editor, Hemisphere Pub. Corp., pp. 530, 557, 574.

Cook et al., "The Thermal Mechanics of Tool Wear", J. of Engineering for Industry, Feb. 1966, pp. 93–100.

Kennametal Brochure entitled "Tools, Tooling Systems, and Services for the Global Metalworking Industry", (1991), pp. 1, 2 and 274.

Siekmann, "How to Machine Titanium", The Tool Engineer, Jan. 1955, pp. 78–82.

Israelsson, "Turning Inserts TTTake Off", Cutting Tool Engineering, Sep. 1993, pp. 36 & 38–40.

Chandler, "Machining of Reactive Metals", Metals Handbook, vol. 16, 9th Ed., pp. 844–857.

Machado et al., "Machining of Titanium and Its Alloys—A Review", Proc. Inst. Mech. Engrs., vol. 204 (1990), pp. 53–60.

Olsson et al., "Chemical Vapour Deposition of Boron Carbides on Uncoated and TiC–Coated Cemented Carbide Substrates", Surface & Coating. Tech., 42 (1990) pp. 187–201.

Jansson, "Chemical Vapor Deposition of Boron Carbides", Mat'ls & Mfg. Processes, vol. 6, No. 3 (1991), pp. 481–500.

Hartung et al., "Tool Wear in Titanium Machining", Annals of CIRP, vol. 31, No. 1 (1982), pp. 75–80.

Narutaki et al., "Study on Machining Titanium Alloys", Annals of CIRP., vol. 32, No. 1 (1983), pp. 65–69.

Peterson et al., "Coatings for Tribological Applications", Fundamentals of Friction and Wear—1980 ASM Seminar, pp. 331–372.

Kossowsky et al., "Friction and Wear", Surface Modification Engineering, vol. 1, CRC Press, Inc., pp. 145–185.

Meyers et al., "Mechanical Metallurgy", Prentice Hall, Inc., pp. 600–624.

Backofen, Deformation Processing, Addison–Wesley Pub. Co., pp. 174–175.

Rabinowicz, Friction and Wear of Materials, John Willey & Sons, pp. 10–31.

Dearnley et al., "Evaluation of Principal Wear Mechanisms of Cemented Carbides and Ceramics Used for Machining Titanium Alloy IMI 318", Mat'ls. Science & Tech., Jan. 1986, vol. 2, pp. 47–58.

Dearnley et al., "Wear Mechanisms of Cemented Carbides and Ceramics Used for Machining Titanium Alloys", High Tech Ceramics, Elsevier Science Publishers (1987), pp. 2699–2712.

Mari and Gonseth, "A New Look at Carbide Tool Life", Wear, 165 (1993), pp. 9–17.

CUTTING TOOL FOR MACHINING TITANIUM AND TITANIUM ALLOYS

This application is a continuation of application Ser. No. 08/572,231 filed on Dec. 13, 1995, now abandoned.

BACKGROUND

The invention pertains to a cutting tool that has improved cutting properties. More specifically, the invention pertains to a cutting tool that has improved cutting properties when machining titanium and titanium alloys.

Titanium metal and many of its alloys present a high strength-weight ratio which is maintained at high temperatures. Titanium metal and its alloys also have exceptional corrosion resistance. These characteristics are very desirable and have been the principal cause for the rapid growth of the titanium industry from the 1950's to the present. The aerospace industry has been the major consumer of titanium and titanium alloys for use in airframes and engine components. Non-aerospace applications include steam turbine blades, superconductors, missiles, submarine hulls, and products where corrosion is a concern.

The complexity of the extraction of titanium, as well as the melting and fabrication thereof, have kept the cost of titanium high. This is in spite of the fact that there has been an increase in usage and production. Thus, while titanium has significant design advantages, its cost remains high.

In regard to the machining of titanium and titanium alloys, these material are difficult to machine for a number of reasons. In machining titanium, a chip is produced which travels across the top of the tool at a speed two to three times faster than when machining steel. The small area of contact between the chip and the surface of the tool, as well as the low thermal conductivity of the titanium and its high ductility which allows for considerable heat-producing shearing of the chip, result in a high temperature at the tool-chip interface. The tool-chip interface temperatures can reach about 1093° C. (2000° F.) at a pressure of about 1.38 to 2.07 gigapascal (200,000 psi to 300,000 psi).

At interface temperatures of about 500° C. (932° F.) and above, which of course includes 1093° C. (2000° F.), titanium and titanium alloys are chemically reactive with the cutting tool material. This chemical reactivity typically increases with an increase in temperature so that at high tool-chip interface temperatures such as 1093° C. the titanium workpiece is very reactive with the tool.

Thus, it is apparent that a cutting tool for use in machining titanium and its alloys should be able to resist the mechanical/thermal wear effect of the high-speed chip travel. Such a tool should also have good high temperature (e.g. 1093° C.) physical properties such as, for example, high thermal conductivity and high specific heat. Such a tool should also have a high compressive strength at high temperatures so as to resist deformation at pressures in the order of 1.38 to 2.07 gigapascal.

The high compressive strength, high hardness, and good thermal conductivity of cemented carbide tools are properties that provide for reasonably good thermodynamic stability, and hence, are consistent with good machining of titanium and titanium alloys. Others have suggested using certain cemented carbide cutting tools to machine titanium and its alloys.

The article "How to Machine Titanium" by Siekmann and published in The Tool Engineer (January, 1955) stated at pages 78 through 82 that the high compressive strength, high hardness, and good thermal conductivity of tungsten carbide tools enabled them to resist excessive deformation pressures, reduce the effect of higher chip speeds, and improve the dissipation of heat due to the higher tool-chip interface temperatures. The Siekmann article mentioned that the cast iron cutting grades had higher thermal conductivity so as to lower the temperature near the tool-chip interface. The higher transverse rupture strength and modulus of elasticity enabled the WC-Co grade to withstand higher loads on the cutting edge without breakage. The WC-Co grade also maintained its rigidity. The high fatigue strength enabled them to withstand rapid fluctuation of tool forces. Keeping the above factors in mind, and the chemical reactivity of titanium, the article stated that for machining titanium the cast iron cutting grades were superior in tool life to steel cutting grades under certain cutting conditions. The specific grade was a WC-6% Co grade.

In the article "Evaluation of principal wear mechanisms of cemented carbides and ceramics used for machining titanium alloy IMI 318" by Dearnley et al. published in Materials Science and Technology (January, 1986) at pages 47–58, the authors recognized over thirty years after the Siekmann article that machining titanium was still a major production problem. For the turning of IMI 318 titanium alloy (Ti-6Al-4V), the authors recommended using a 6 weight percent cobalt-WC (WC grain size not less than 0.8 micrometers) cutting tool to machine the IMI 318 titanium alloy. The Carboloy 883 alloy possibly may be a 6 weight percent cobalt grade in view of the disclosure of U.S. Pat. No. 4,583,431 to Komanduri et al. at Col. 4, line 18.

Other articles make mention of cutting tool materials other than WC-Co. For example, in the article "Tool Wear in Titanium Machining", by Hartung et al., published in the Annals of the CIRP (Vol. 31/1/1982) at pages 75–80, the authors list tool materials to include alumina, cubic boron nitride and diamond, as well as coated and uncoated tungsten carbide-cobalt and their wear rates. It is clear that some cutting tools have more potential than others. In regard to the C2 class of cutting tools, the Kennametal K68 grade had 5.4 to 5.9 cobalt along with an addition of tantalum.

The article entitled "Wear Mechanisms of Cemented Carbides and Ceramics Used for Machining Titanium Alloys", by Dearnley et al. published in High Tech Ceramics (Elsevier Science Publishers, 1987) at pages 2699–2712 discussed the testing of the following cutting tools for machining a titanium alloy (Ti-6Al-4v): WC-6% Co; WC-5.5%Co—8.6% (TiC+TaC+NbC); WC-9.5% Co-21.9% (TiC+TaC+NbC); WC-9.5%Co-35% (TiC+TaC+ NbC); alumina+6% Zirconia; alumina+15% Zirconia; alumina+15% Zirconia+10% TiC; SiAlON; and cubic Boron Nitride. This article concluded that the straight grade cemented carbides are the most suitable materials to machine titanium alloys. In this article, these straight grades appeared to have been WC-6% Co with a WC grain size of 1.4 μm, and WC-6% Co with a WC grain size of 0.8 μm. The article by Israelsson entitled "Turning inserts TTTake Off", published in the September, 1993 issue of Cutting Tool Engineering at pages 36–40 mentioned that an uncoated C-2 grade was the best choice to machine titanium. The article by Machado et al. entitled "Machining of Titanium and its alloys—a Review" published in the Journal of Engineering Manufacture, Vol. 204 at pages 53–60 (1990) recommended a WC/Co alloy with a cobalt content of 6 weight percent and a WC grain size of 0.8 to 1.4 μm.

U.S. Pat. No. 5,325,747 to Santhanam et al. entitled METHOD OF MACHINING USING COATED CUTTING TOOLS (assigned to the assignee of the present patent application) mentioned that an uncoated WC-Co tool (6.0 w/o Co-0.5 w/o $Cr_3C_2$—93.5 w/o WC) was one of the best tool materials to use to machine titanium. This patent mentioned that the uncoated tool was limited to low speeds. The '747 Patent disclosed the use of a WC-Co substrate with a PVD coating of TiN applied over a CVD coating. The cobalt content of the substrates of the examples ranged between 6.0 weight percent and 11.5 weight percent.

U.S. Pat. No. 5,145,739 to Sarin entitled ABRASION RESISTANT COATED ARTICLES recognized the problems associated with machining titanium and its alloys to include high cutting temperatures, and high chemical reactivity. The '739 Patent disclosed, inter alia, the application of a coating or coating scheme to a substrate such as WC-Co or WC-Co-γ (WC-Co-cubic carbides).

U.S. Pat. No. 4,828,584 to Cutter for DENSE, FINE—GRAINED TUNGSTEN CARBIDE CERAMICS AND METHOD FOR MAKING THE SAME also recognized the obstacles associated with machining titanium. This patent disclosed a cutting tool comprised of an essentially dense, fine-grained, polycrystalline tungsten carbide. The '584 Patent did not teach the inclusion of cobalt in the cutting tool.

The article by Chandler entitled "Machining of Reactive Metals" in the Metals Handbook Ninth Edition, Vol. 16 at pages 844-857 recognized the difficulties in machining titanium. This article mentioned that the C-2 grade tool material can be used to machine commercially pure titanium, alpha alloys of titanium, alpha-beta alloys of titanium, and beta alloys of titanium.

In a Kennametal (1991) brochure, the Kennametal grades KC730, KC720 and K313 are suggested as suitable to machine titanium and its alloys. K313 is shown as Substrate No. 2 in the '747 Patent to Santhanam et al. KC730 comprises a PVD TiN coating over the K313 substrate. KC720 comprises a substrate having 11.5 weight percent cobalt, 1.9 weight percent tantalum, 0.4 weight percent niobium, and the balance tungsten carbide. A PVD TiN coating is applied to the substrate to form the KC720 product.

SUMMARY

It is an object of the invention to provide a cutting tool that has improved properties making it suitable for the machining of titanium and its alloys.

It is another object of the invention to provide a cutting tool for machining titanium and its alloys that has improved resistance to wear caused by high speed chip travel.

It is another object of the invention to provide a cutting tool for machining titanium and its alloys that has good heat dissipation properties.

It is another object of the invention to provide a cutting tool for machining titanium and its alloys that has a high compressive strength so as to be able to resist deformation.

In one form thereof, the invention is a cutting tool for machining titanium and titanium alloys that comprises a substrate comprising tungsten carbide. The cutting tool further includes a coating selected from the group consisting of tungsten carbide and boron carbide and applied to the substrate by physical vapor deposition.

In another form thereof, the invention is a cutting tool for machining titanium and titanium alloys wherein the tool comprises a substrate comprising tungsten carbide. The cutting tool further includes a coating comprising boron carbide applied to the substrate by chemical vapor deposition.

In still another form thereof, the invention is a cutting tool for machining titanium and titanium alloys which comprises a substrate comprising tungsten carbide and cobalt wherein the cobalt ranges between 0.2 and 2.9 weight percent of the substrate. The tool further includes a tungsten carbide tip brazed to the substrate. The tool also comprises a coating selected from the group consisting of tungsten carbide and boron carbide and applied by physical vapor deposition to the tungsten carbide tip.

In still another form thereof, the invention is a cutting tool for machining titanium and titanium alloys comprising a substrate comprising tungsten carbide and cobalt wherein the cobalt ranges between 0.2 and 2.9 weight percent of the substrate. The tool also includes a tungsten carbide tip brazed to the substrate. The tool further has a coating of boron carbide applied by chemical vapor deposition to the tungsten carbide tip.

In yet another form, the invention is a cutting tool for machining titanium and titanium alloys which comprises a substrate with a hard coating applied thereto. The calculated wear rate for the cutting tool is less than or equal to about 3.9 μm/minute.

BRIEF DESCRIPTION OF THE DRAWINGS

The following is a brief description of the drawings that form a part of this patent application.

DETAILED DESCRIPTION

Figure 1:
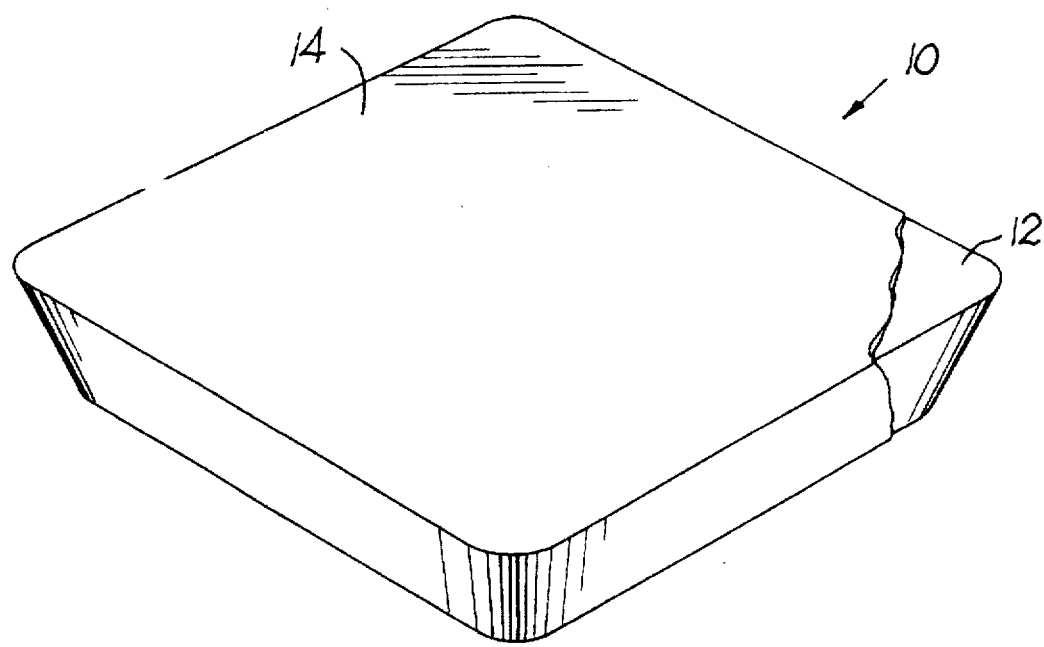
FIG. 1 is a perspective view of a coated cutting tool with a portion of the coating removed from the substrate.

Referring to FIG. 1, the coated cutting tool 10 has a substrate 12. The substrate is a cemented tungsten carbide-cobalt composition sold by Kennametal Inc. of Latrobe, Pa. (assignee of the present patent application) under the designation K11. The typical composition of the K11 substrate comprises: 2.3 to 2.9 weight percent cobalt; 0 to 0.4 weight percent tantalum; 0 to 0.1 weight percent titanium, 0 to 0.1 weight percent niobium, and the balance tungsten carbide. Other properties of the K11 substrate include: a hardness of between 92.8 and 93.6 Rockwell A, a coercive force of between 290 and 440 oersteds, a specific gravity of 15.10 to 15.50 gr/cc, and a WC grain size of 1 to 6 micrometers. Although the specific embodiment uses a cemented tungsten carbide substrate, the applicant does not consider the invention to be limited to only this type of substrate. Applicant contemplates that the invention includes substrates such as, for example, a binderless tungsten carbide.

The cutting tool 10 further includes a coating 14. The coating can be a coating of tungsten carbide (WC) applied by PVD (physical vapor deposition) techniques. These physical vapor deposition techniques include, but are not limited to, ion plating, magnetic sputtering and arc evaporation.

The coating may also be a coating of boron carbide ($B_4C$) applied by chemical vapor deposition (CVD). The article Jansson, "Chemical Vapor Deposition of Boron Carbides", *Materials & Manufacturing Processes* 6(3), pp. 481–500 (1991) discusses and discloses chemical vapor deposition techniques of boron carbide. The article Olsson et al., "Chemical vapour deposition of boron carbides on uncoated and TiC-coated cemented carbide substrates", *Surface and Coatings Technologies*, 42, (1990), pp. 187–201 discusses the CVD application of boron carbide to a tungsten carbide-cobalt substrate. The boron carbide may also be applied by a plasma enhanced chemical vapor deposition (PECVD) technique. The PECVD technique is described in U.S. Pat. No. 5,421,891 to Campbell et al. for a HIGH DENSITY PLASMA DEPOSITION AND ETCHING APPARATUS.

Because a cutting tool with a CVD boron carbide coating presents an acceptable theoretical wear rate, applicant believes that a cutting tool with a PVD boron carbide coating should provide an even better theoretical wear rate. Applicant thus considers the invention to include a cutting tool with a PVD boron carbide coating.

In regard to specific PVD processes, applicant considers that the electron beam physical vapor deposition (EB-PVD) technique would be appropriate for the deposition of the boron carbide and tungsten carbide coatings. The EB-PVD process is described in U.S. Pat. No. 5,418,003 to Bruce et al. for VAPOR DEPOSITION OF CERAMIC MATERIALS.

Applicant also considers that the sputtering method would be suitable for the PVD application of boron carbide and tungsten carbide. U.S. Pat. No. 5,427,665 to Hartig et al. for PROCESS AND APPARATUS FOR REACTIVE COATING OF A SUBSTRATE discloses a sputtering process.

U.S. Pat. No. 5,292,417 to Kugler for a METHOD FOR REACTIVE SPUTTER COATING AT LEAST ONE ARTICLE, U.S. Pat. No. 5,413,684 to Bergmann for a METHOD AND APPARATUS FOR REGULATING A DEGREE OF REACTION IN A COATING PROCESS, and U.S. Pat. No. 5,415,756 to Wolfe et al. for an ION ASSISTED DEPOSITION PROCESS INCLUDING REACTIVE SOURCE GASSIFICATION each disclose apparatus and methods that would be suitable or the PVD deposition of boron carbide or tungsten carbide.

Figure 2:
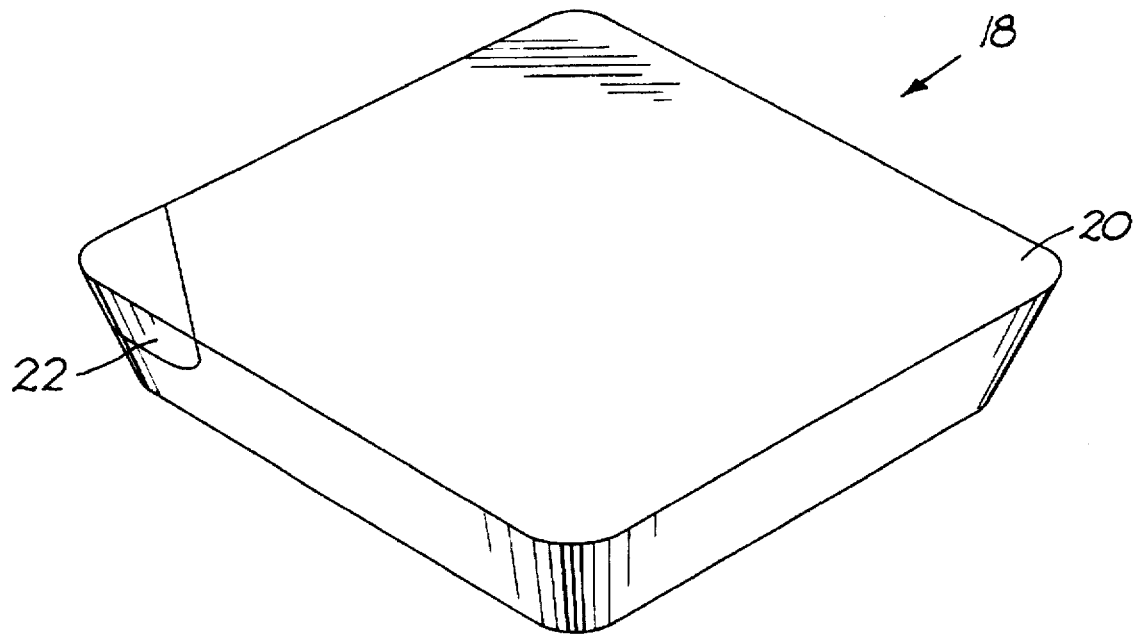
FIG. 2 is a perspective view of a cutting tool with a brazed-on tip.

Referring to FIG. 2, the cutting tool 18 includes a substrate 20 with a brazed on tip 22. Although the substrate 20 may be made from the same material (WC-Co) as the substrate 12 of the first specific embodiment, applicant considers the invention to include other substrates such as, for example, binderless tungsten carbide. The tips 22 typically comprise tungsten carbide in either an uncoated condition or with a coating such as a PVD WC coating, a CVD $B_4C$ coating or a PVD $B_4C$ coating The readiness with which titanium and its alloys react with cutting tool materials suggests a strong likelihood that attrition of the tool material will be a significant factor in the overall wear of the cutting tool. Because of the relatively high temperatures (about 1100° C.) that exist within the crater region of the cutting tool, it is likely that material loss will also occur through the mechanism of diffusion.

The wear by attrition is defined by the following relation (Peterson et al., *Fundamentals of Friction and Wear of Materials*, D. A. Rigney, ed., ASM, Netals Park, Ohio (1981), p. 351):

$$W_{ATT} \alpha \, \mu/U$$

where μ is the coefficient of friction and U is the ultimate tensile strength of the material which is worn most rapidly. The coefficient of friction (μ) behaves according to the following relation (Kossowsky et al., *Surface Modification Engineering, Vol. 1 Fundamental Aspects*, CRC Press, Boca Raton, Fla. (1989), p. 159):

$$\mu \alpha \, E/K_{IC}$$

where E is the modulus of elasticity and $K_{IC}$ is the critical stress intensity factor for plane strain wherein both E and $K_{IC}$ are taken at room temperature.

The reference temperature for the contribution to wear by attrition is 750° C. (1381° F.) since this is the minimum temperature within the crater region near the cutting edge for cutting speeds of 61 to 110 surface meters per minute (200 to 360 SFM). For those materials which are brittle at temperature below 800° C. (1471° F.), the room temperature ultimate tensile strength (U) and hardness ($H_{RT}$) are related by the following relation (Meyers et al., *Mechanical Metallurgy—Principles and Applications*, Prentice-Hall, Englewood Cliffs, N.J. (1984), p. 603):

$$U=3H_{RT}$$

By making the appropriate substitutions, the wear by attrition is defined by the following relation:

$$W_{ATT}=E/(3H_{RT}K_{IC})$$

The inverse of the wear by attrition is the resistance to wear by attrition, and is thus defined by the following relation:

$$R_{ATT}=3H_{RT}K_{IC}/E$$

TABLE I

Selected Parameters to Calculate the Resistance to Wear by Attrition in the Turning of Titanium Alloys

| Material | $H_{RT}$ (GPa) | $K_{IC}$ (MPam$^{1/2}$) | E (GPa) | $R_{ATT}$ (MPam$^{1/2}$) |
|---|---|---|---|---|
| C2 Carbide | 18.1 | 9.7 | 627 | 0.84 |
| K11 Substrate | 18.5 | 8.0 | 655 | 0.68 |
| CVD $B_4C$ | 43.5 | 4.5 | 427 | 1.37 |
| PVD WC | 32.5 | 6.5 | 704 | 0.90 |
| Bulk WC | 21.7 | 6.5 | 704 | 0.60 |

Referring to some of the above materials, the C2 carbide is a standard grade of tungsten carbide-cobalt according to the ISO classification. The K11 materials has been described above. The bulk WC is a binderless tungsten carbide.

In order to take into account the energy necessary to break the asperity tool-workpiece bonds formed during the metal cutting, i.e., material removal, operation, the resistance to attrition wear is modified by the energy on a unit area basis ($W_{ab}$) according to the following relation:

$$R'_{ATT}=R_{ATT}/W_{ab}$$

The energy necessary to break the bonds is calculated according to the following relation (Backofen, *Deformation Processing*, Addison-Wesley, Reading Mass. (1972), pp. 174–175):

$$W_{ab}=\gamma_a+\gamma_b-\gamma_{ab}$$

where the term "γ" is a surface energy in erg/cm². Here $\gamma_a$ refers to the surface energy for the tool, $\gamma_b$ refers to the surface energy for the workpiece, and $\gamma_{ab}$ refers to the surface energy for the tool-workpiece interface.

Coating materials of interest, i.e., tungsten carbide and boron carbide, have at least a fair degree of solubility in solid titanium at the typical interface temperatures so that the surface energy for the tool-workpiece interface is (Rabinowicz, *Friction and Wear of Materials*, Wiley, New York, New York (1965), p. 30):

$$\gamma_{ab}=0.25(\gamma_a+\gamma_b)$$

The substitution of the above relation into the relation for the energy of the tool-workpiece interface results in the following relation:

$$W_{ab}=0.75(\gamma_a+\gamma_b)$$

The surface energy $\gamma_n$ of a material has been observed to be proportional to the ⅓rd power of its room temperature hardness ($H_{RT}$) [Rabinowicz document at page 28]. By using the data from the Rabinowicz publication, the following relation was determined:

$$\gamma\mu=-200+75(H_{RT})^{1/3}$$

The input data for the Ti-6Al-4V workpiece material equals a room temperature hardness of 800 kg/mm² (Narutaki et al., *Annals of the CIRP*, Vol. 32, 1983), p. 65), and a surface energy of 495 erg/cm². Table II below sets out the attrition resistance of coating materials and substrate materials in the turning of titanium alloys.

TABLE II

Attrition Resistance of Coating and Substrate Materials in the Turning of Titanium Alloys

| Material | $R_{ATT}$ (MPam$^{1/2}$) | $\gamma$ (erg/cm²) | $W_{ab}$ (erg/cm²) | $10^4 R'_{ATT}$ (MPam$^{1/2}$ cm²/erg) |
|---|---|---|---|---|
| C2 Carbide | 0.84 | 700 | 896 | 9.4 |
| K11 | 0.68 | 718 | 910 | 7.5 |
| CVD B₄C | 1.37 | 1021 | 1137 | 12.08 |
| PVD WC | 0.90 | 911 | 1055 | 8.56 |
| Bulk WC | 0.60 | 768 | 947 | 6.33 |

The other principal component for wear in the turning of titanium and titanium-based alloys is diffusion of elements of the tool into the chip as it moves over the surface of the tool. The rate of maximum tool wear according to this mechanism ($W_{diff}$) has been calculated by Cook and Nayak (Cook et al., *Journal of Engineering for Industry*, Vol. 88 (1966), p. 93) to be the following relation:

$$W_{diff}=(K'/10.64)\times C\times (D/\pi t)^{1/2}$$

The term "K" is the molar volume of the coating material divided by the molar volume of titanium, which is 10.64 cm³/mole. The molar volume is the molecular weight (gm/mole) divided by the theoretical density (gm/cm³). The term "C" is the solubility of the coating material in -titanium at the maximum interface temperature of 1100° C. The term "D" is the diffusion coefficient of the slowest moving element of the coating in titanium at a temperature of 1100° C. The term "t" is the duration in seconds of the tool-chip interface. According to the Cook et al., article mentioned above, the duration of the tool-chip contact is about 3.2× 10⁻⁵ seconds.

In regard to solubility of certain coating materials of interest; namely, PVD WC and CVD B₄C, the following Table III sets forth solubility data along with an identification of the least soluble element in titanium at 1100° C.

TABLE III

Solubility of Materials in Titanium at 1100° C.

| Material | Least Soluble Element | Solubility (mole fraction) |
|---|---|---|
| WC | C | $6 \times 10^{-3}$ |
| B₄C | B | $2.5 \times 10^{-3}$ |

The above solubilities were calculated according to the method in which the solubility is based upon the assumption that the solubility of a material in titanium is limited by the solubility of the least soluble component of that material divided by the number of atoms of that component per molecule of material.

In regard to the diffusion coefficients (D in cm²/sec at 1100° C.), the following relation was used:

$$D=D_o e^{-Q/RT}$$

$D_O$ is the pre-exponential factor (cm²/second) which relates to the frequency that a mobile atom or ion approaches an activation energy barrier. Q is the "height" of the barrier. R is the universal gas constant (1.99 cal/mole K). T is the temperature in degrees Kelvin. Because the temperature of interest is 1100° C., $D_O$ and Q were determined with the solvent being -titanium. The rate of transport of a compound within a solid solution is determined by the diffusion rate of the slowest compound.

TABLE IV

Data Used in the Calculation of Wear by Diffusion for Selected Coating Materials

| Material | K' (cm³/mole) | D (cm²/sec) | $W_{diff}$ (μm/minute) |
|---|---|---|---|
| PVD WC | 12.41 | $1.41 \times 10^{-5}$ | 8.46 |
| CVD B₄C | 22.31 | $1.88 \times 10^{-5}$ | 11.28 |

For multiple phase materials such as, for example WC-Co, the procedure for calculating the value of "C" and "D" is like that for single phase materials. Consideration was given, however, to apportioning the wear rate according to the volume fractions of WC and cobalt. At 1100° C. the theoretical upper bound wear rates are 8.5 μm/minute and 2389 μm/minute for WC and cobalt, respectively. A comparison between these wear rates shows that the proposition that a wear rate calculation is made on the basis of the slowest diffusing element of the phase of greatest volume fraction is accurate, and that apportioning is not called for. Diffusion resistance ($R_D$) is defined as the reciprocal of the diffusion wear rate wherein the latter is expressed in micrometers per minute. The diffusion resistances of PVD-WC and CVD-B₄C in titanium at 1100° C. (2010° F.) are set forth below in Table V.

TABLE V

Diffusion Resistances of Materials in Titanium at 1100° C.

| Material | Diffusion Resistance ($10^3$ $R_D$) |
|---|---|
| WC (PVD) | 117.9 |
| $B_4C$ (CVD) | 88.74 |

In regard to the thermal conductivity of multi-phase materials, according to Neumann and Kny (Neumann et al., *High Temperature—High Pressures*, Vol. 21 (1989), p. 525), for a two component composite the thermal conductivity is given by the following relation:

$$k_c = k_1^{f_1} \times k_2^{f_2}$$

The subscripts refer to the phases in the composite. The term "f" refers to the respective volume fraction.

In regard to the temperature at which to determine thermal conductivity, the point directly beneath the crater is at about 300° C. The average crater temperature is about 925° C. The average between these temperatures results in a temperature of about 600° C. (1111° F.) for estimating the thermal conductivity of the insert.

For tools having a brazed on cutting tip that is of a thickness of 500 μm or more, the thermal conductivity of the composite is well represented by the arithmetic average of the two components. For thinly coated tools, i.e., a coating of less than 20 μm, the coating does not contribute sufficiently to be a part of the calculation of the thermal conductivity. A thicker coating will result in a contribution by the coating material. For example, a coating of 30 μm will contribute 10 percent of the thermal conductivity while a coating of 60 μm will contribute 20 percent of the thermal conductivity.

To determine the thermal conductivity of WC at elevated temperatures, the common behavior between WC and other transition metal carbides resulted in a correlation between the behavior of these other carbides and WC at room temperature of 120 w/mK to arrive at a value at 600° C. of 127 w/mK. The thermal conductivity for cobalt at 600° C. is 55 w/mK.

The values for the thermal conductivity of selected substrate materials is set forth in the Table VI below.

TABLE VI

Thermal Conductivity of Materials at 600° C.

| Material | $k_c$ at 600° C. (W/mK) |
|---|---|
| K11 Substrate | 85 |
| WC | 127 |
| C2 Carbide | 80 |

The following proposed examples represent cutting tool materials, that have an excellent overall wear resistance factor, and thus, are excellent cutting tool candidates to machine titanium and titanium alloys.

In regard to the conditions for the cutting of titanium or titanium alloys, various test conditions from the literature for the cutting of Ti-6Al-4V are set forth hereinafter. The speed ranges between 61 and 110 surface meters per minute (200 to 361 SFM). The feed ranges between 0.010 and 0.036 cm/revolution (0.004 and 0.014 inches per revolution). The depth of cut ranges between 0.10 and 0.20 cm (0.04 and 0.08 inches). The cutting was dry.

The resistance to cratering may be expressed by the following relation:

$$R_{CR} \alpha (R'_{ATT})^X (R_D)^Y (k_{substr})^Z$$

After making comparisons between the actual experimental results and the theoretical results using the above relation, it appears that the resistance to cratering in the turning of titanium or titanium-based alloys is best expressed by the relation:

$$R_{CR} \alpha 10^4 (R'_{ATT})(10^3 R_D)^{0.6} (k_{substr})$$

To calculate the wear rate of substrate materials, the following relation was used:

$$\text{Max. Wear Rate (μm/min.)} = 0.5 \times 10^5 \{10^4 R'_{ATT}(10^3 R_D)^{0.6} k_{substr}\}^{-1}$$

The Table VII below sets forth the results for the calculation of the wear rates for a PVD WC coated K11 tungsten carbide-cobalt substrate, a CVD $B_4C$ coated K11 tungsten carbide-cobalt substrate, a PVD WC coated-WC tipped K11 tungsten carbide-cobalt substrate, a CVD $B_4C$ coated-WC tipped K11 tungsten carbide-cobalt substrate, a PVD WC coated binderless tungsten carbide substrate, and a CVD $B_4C$ coated binderless tungsten carbide substrate. For comparison purposes, the Table VII also sets forth the results of the calculation of the wear rates for an uncoated K68 grade (C2 grade) of tungsten carbide substrate, and an uncoated K11 tungsten carbide-cobalt substrate.

TABLE VII

Results of Calculations of the Theoretical Wear Rate

| Example | Substrate | Coating | Tip | Wear Rate (μm/min) |
|---|---|---|---|---|
| 1 | K11 | PVD WC | — | 3.9 |
| 2 | K11 | CVD $B_4C$ | — | 3.4 |
| 3 | K11 | PVD WC | WC Tip | 3.1 |
| 4 | K11 | CVD $B_4C$ | WC Tip | 2.7 |
| 5 | WC | PVD WC | — | 2.6 |
| 6 | WC | CVD B4C | — | 2.3 |
| — | K11 | — | — | 4.5 |
| — | K68 | — | — | 4.1 |

It is apparent that these theoretical wear rates are improvements over the K68 grade (uncoated C2 grade) of cutting tool and the uncoated K11 cutting tool.

The above description pertains to certain specific substrates and coating schemes; however, applicant considers the invention to encompass cutting tools for the machining of titanium and its alloys that have a calculated maximum wear rate that is less than or equal to about 3.9 μm/minute. These cutting tools include tools that are without a tip and are coated, as well as tools that present a coated tip.

Applicant also contemplates that the invention to encompass cutting tools as described above that have a resistance to wear by attrition ($10^4 R'_{ATT}$) of between 3.4 and 16.7 MPam$^{1/2}$. The resistance to wear by diffusion ($10^3 R_D$) is between 0.5 and 136.2. The thermal conductivity of the substrate ($K_{substr}$) is between 6.4 and 300 W/mK.

The patents and other documents identified herein are hereby incorporated by reference herein.

Other embodiments of the invention will be apparent to those skilled in the art from a consideration of the specification or practice of the invention disclosed herein. It is intended that the specification and examples be considered as illustrative only, with the true scope and spirit of the invention being indicated by the following claims.

What is claimed is:

1. A cutting tool for machining titanium and titanium alloys comprising:
   a substrate comprising tungsten carbide; and
   a coating selected from the group consisting of tungsten carbide and boron carbide and applied to the substrate by physical vapor deposition.

2. The cutting tool of claim 1 wherein the substrate further includes cobalt in the range of between 0.2 to 2.9 weight percent.

3. The cutting tool of claim 2 wherein the cobalt in the substrate ranges between 2.3 and 2.9 weight percent.

4. The cutting tool of claim 3 wherein the substrate further includes 0 to 0.4 weight percent tantalum; 0 to 0.1 weight percent titanium, and 0 to 0.1 weight percent niobium.

5. The cutting tool of claim 2 wherein the substrate has a hardness of between 92.8 and 93.6 Rockwell A, a coercive force of between 290 and 440 oersteds, a specific gravity of 15.10 to 15.50 gr/cc, and a WC grain size of 1 to 6 micrometers.

6. The cutting tool of claim 5 wherein the calculated wear rate for the cutting tool when machining titanium and titanium alloys is less than or equal to 3.9 μm/minute.

7. The cutting tool of claim 1 wherein the coating is tungsten carbide.

8. The cutting tool of claim 1 wherein the coating is boron carbide.

9. A cutting tool for machining titanium and titanium alloys comprising:
   a substrate comprising tungsten carbide; and
   a coating comprising boron carbide applied to the substrate by chemical vapor deposition.

10. The cutting tool of claim 9 wherein the substrate further includes cobalt in the range of between 0.2 to 2.9 weight percent.

11. The cutting tool of claim 10 wherein the cobalt in the substrate ranges between 2.3 and 2.9 weight percent.

12. The cutting tool of claim 11 wherein the substrate further includes 0 to 0.4 weight percent tantalum; 0 to 0.1 weight percent titanium, and 0 to 0.1 weight percent niobium.

13. The cutting tool of claim 10 wherein the substrate has a hardness of between 92.8 and 93.6 Rockwell A, a coercive force of between 290 and 440 oersteds, a specific gravity of 15.10 to 15.50 gr/cc, and a WC grain size of 1 to 6 micrometers.

14. The cutting tool of claim 13 wherein the calculated wear rate for the cutting tool when machining titanium and titanium alloys is less than or equal to 3.4 μm/minute.

15. A cutting tool for machining titanium and titanium alloys comprising:
   a substrate comprising tungsten carbide and cobalt wherein the cobalt ranges between 0.2 and 2.9 weight percent of the substrate;
   a tip brazed to the substrate, the tip comprising tungsten carbide; and
   a coating selected from the group consisting of tungsten carbide and boron carbide and applied by physical vapor deposition to the tungsten carbide tip.

16. The cutting tool of claim 15 wherein the substrate has a cobalt content between 2.3 and 2.9 weight percent.

17. The cutting tool of claim 16 wherein the substrate has a hardness of between 92.8 and 93.6 Rockwell A, a coercive force of between 290 and 440 oersteds, a specific gravity of 15.10 to 15.50 gr/cc, and a WC grain size of 1 to 6 micrometers.

18. The cutting tool of claim 17 wherein the calculated wear rate for the cutting tool machining titanium and titanium alloys is less than or equal to 3.1 μm/minute.

19. The cutting tool of claim 15 wherein the coating comprises tungsten carbide.

20. The cutting tool of claim 15 wherein the coating comprises boron carbide.

21. A cutting tool for machining titanium and titanium alloys comprising:
   a substrate comprising tungsten carbide and cobalt wherein the cobalt ranges between 0.2 and 2.9 weight percent of the substrate;
   a tip brazed to the substrate, the tip comprising tungsten carbide; and
   a coating of boron carbide applied by chemical vapor deposition to the tungsten carbide tip.

22. The cutting tool of claim 21 wherein the substrate has a cobalt content between 2.3 and 2.9 weight percent.

23. The cutting tool of claim 22 wherein the substrate has a hardness of between 92.8 and 93.6 Rockwell A, a coercive force of between 290 and 440 oersteds, a specific gravity of 15.10 to 15.50 gr/cc, and a WC grain size of 1 to 6 micrometers.

24. The cutting tool of claim 23 wherein the calculated wear rate for the cutting tool when machining titanium and titanium alloys is less than or equal to 2.7 μm/minute.

25. A cutting tool for machining titanium and titanium alloys comprising:
   a substrate:
   a hard coating applied to the substrate; and
   the calculated wear rate for the cutting tool when machining titanium and titanium alloys is less than or equal to about 3.9 μm/minute.

26. The cutting tool of claim 25 wherein the calculated resistance to wear by attrition for the cutting tool when machining titanium and titanium alloys is between 3.4 and 16.7 $MPam^{1/2}$.

27. The cutting tool of claim 25 wherein the calculated resistance to wear by diffusion for the cutting tool when machining titanium and titanium alloys is between 0.5 and 136.2.

28. The cutting tool of claim 25 wherein the thermal conductivity of the substrate is between 6.4 and 300 W/mk.

29. A cutting tool for machining titanium and titanium alloys comprising:
   a substrate;
   a tip brazed to the substrate; and
   a coating applied by physical vapor deposition to the tip wherein the calculated wear rate for the cutting tool when machining titanium and titanium alloys is less than or equal to about 3.9 μm/minute.

30. The cutting tool of claim 29 wherein the calculated resistance to wear by attrition for the cutting tool when machining titanium and titanium alloys is between 3.4 and 16.7 $MPam^{1/2}$.

31. The cutting tool of claim 29 wherein the calculated resistance to wear by diffusion for the cutting tool when machining titanium and titanium alloys is between 0.5 and 136.2.

32. The cutting tool of claim 29 wherein the thermal conductivity of the substrate is between 6.4 and 300 W/mk.

* * * * *